(12) United States Patent
Schmidt et al.

(10) Patent No.: US 6,486,394 B1
(45) Date of Patent: Nov. 26, 2002

(54) PROCESS FOR PRODUCING CONNECTING CONDUCTORS

(75) Inventors: Walter Schmidt, Russikon (CH); Marco Martinelli, Neftenbach (CH)

(73) Assignee: Dyconex Patente AG, Zug (CH)

( * ) Notice: Subject to any disclaimer, the term of this patent is extended or adjusted under 35 U.S.C. 154(b) by 0 days.

(21) Appl. No.: 09/230,713

(22) PCT Filed: Jul. 17, 1997

(86) PCT No.: PCT/CH97/00277

§ 371 (c)(1),
(2), (4) Date: Aug. 16, 1999

(87) PCT Pub. No.: WO98/06243

PCT Pub. Date: Feb. 12, 1998

(30) Foreign Application Priority Data

Jul. 31, 1996 (CH) .............................................. 1903/96

(51) Int. Cl.[7] ................................................. H01B 7/34
(52) U.S. Cl. ............................. 174/36; 29/846; 29/852; 29/830; 156/52; 174/262
(58) Field of Search ................................ 174/255, 262, 174/36; 361/792, 793, 794, 795; 29/846, 852, 830; 156/51, 52

(56) References Cited

U.S. PATENT DOCUMENTS

| | | | |
|---|---|---|---|
| 5,426,399 A | * 6/1995 | Matsubayashi et al. | ........ 174/36 |
| 5,438,167 A | * 8/1995 | McClanahan et al. | ......... 174/36 |
| 5,639,389 A | 6/1997 | Schmidt et al. | ................ 216/18 |
| 5,828,555 A | * 10/1998 | Itoh | ............................ 361/784 |
| 5,841,075 A | * 11/1998 | Hanson | ....................... 174/250 |
| 6,236,572 B1 | * 5/2001 | Teshome et al. | ............. 361/794 |

FOREIGN PATENT DOCUMENTS

| | | |
|---|---|---|
| DE | 88 00 612 | 4/1988 |
| EP | 0 337 331 | 10/1989 |
| EP | 0 668 712 | 8/1995 |
| GB | 2 277 832 | 11/1994 |
| SE | 8801214 | * 5/1990 |
| WO | WO 93/26143 | 12/1993 |

OTHER PUBLICATIONS

Patent Abstracts of Japan, vol. 14, No. 533, Hitachi chemical Co., Iwasaki Yorio et al, Crosstalk Noise Reduced Wiring Board and Manufacture Thereof, JP 02 224398, Sep. 6, 1990.

Havant GB, "Reducing Crosstalk in Coplanar PC Signal Lines", Research Disclosure No. 28448, Dec. 1987, p. 785, XP002024706.

* cited by examiner

*Primary Examiner*—Kamand Cuneo
(74) *Attorney, Agent, or Firm*—Rankin, Hill, Porter & Clark LLP (57) ABSTRACT

A method for the manufacture of screened or shielded interconnecting conductors (1) begins with semifinished foil products (H1, H2, H3), a first semifinished foil product (H1) having at least one layer of conductors (10, 10', 12, 12', 13, 13') including signal conductors (10, 10') and shielding conductors (12, 12', 13, 13'). Another semifinished foil product (H2, H3) has shielding material (23, 33), which is joined by a dielectric (15, 25, 35) to at least one layer of conductors (10, 10', 12, 12', 13, 13'), in which the shielding material (23, 33) is provided by photochemical structuring near the shielding conductors (12, 12', 13, 13') with openings (22, 22', 32, 32') extending to the dielectric (15, 25, 35). The dielectric (15, 25, 35) is removed in accordance with the openings (22, 22, 32, 32) extending to the shielding conductors (12, 12', 13, 13') and by means of the openings (22, 22', 32, 32') the shielding material (22, 33) is electrically contacted with the shielding conductors (12, 12', 13, 13') so that signal conductors (10, 10') are insulated by dielectric (15, 25, 35) and shielded by shielding conductors (12, 12', 13, 13') which are electrically connected to the shielding material (23, 33).

16 Claims, 6 Drawing Sheets

PROCESS FOR PRODUCING CONNECTING CONDUCTORS

FIELD OF THE INVENTION

This invention relates to the manufacture of interconnecting conductors or conducting bodies and relates to a method for the simple, inexpensive manufacture of extremely thin and extremely finely structured, shielded or screened interconnecting conductors.

BACKGROUND OF THE INVENTION

Modern electronics are developing at a very rapid pace and require ever more inexpensive and ever more compact components. Reference is made as an example to printed circuit boards, which have ever higher interconnection densities and carry and connect ever more electronic components such as Surface Mounted Devices (SMD) or Leadless Ceramic Chip Carriers (LCCC). Particular reference is made to the substrates for the production of Multichip Modules (MCM), which increasingly carry and connect uncased components (bare Si-chips).

Such an increase in the interconnection density of printed circuit boards is implemented in accordance with the DYCOstrate® method and is, e.g., disclosed in published international application WO93/26,143. Thin plastic films are plasma- or chemically-etched for forming electric plated-through holes and for electrical passages in the z-direction. This method allows simultaneous, very expensive production of very small holes with a selectable shape. Beside a massive increase in the attainable interconnection density, the DYCOstrate® process has a number of further advantages, which are described in the aforementioned document.

The high interconnection density in the case of non-uniform conductor spacing of modern printed circuit boards leads, in high frequency applications (frequency>1 GHz) to problems, such as excessive attenuation and undesired reflections or cross-talk of signals. Therefore, the interconnecting conductors of the printed circuit boards must have a very uniform mutual spacing or, even better, they must be produced as partly or completely shielded interconnecting conductors.

SUMMARY OF THE INVENTION

An object of the present invention is to provide a method for bringing about simple, inexpensive manufacture of electrically screened or shielded interconnecting conductors from etchable semifinished foil products with extremely thin and extremely fine conductor configurations. Use is made of known, proven procedures, materials, etc. For example, the known wet chemical process is used for producing the conductor configurations or structures. These interconnecting conductors must be compatible with known systems, such as the DYCOstrates® process with regards to the further processing and, in particular, assembly and application. In addition, the manufacture of the interconnecting conductors using semifinished foil products must be suitable for use automatically, e.g. roll-to-roll, and in a batch operation by charging, e.g., the use of support plates must also be possible.

It has surprisingly been found that in the DYCOstrate® process not only point-like arranged, electric vias or through-holes in the z-direction but also surface vias in the z-direction (openings in the form of slots or grooves) can be precisely produced. This is utilized according to the invention in order to shield the signal conductors in a specific layer of a semifinished foil product by producing surface vias of shielding material in other layers. These shielding material vias are obtained by winding the shielding material around the signal conductor insulated by dielectric material. This winding around can take place by plating-on (electrodeposition) further shielding material, or by screen printing, dispenser application and manual application of further shielding material. Thus, one or more signal conductor layers can be partly or completely shielded. This production of shielded interconnecting conductors from, e.g., etchable semifinished foil products with extremely thin and extremely fine conductor configurations is compatible with standard procedures of the printed circuit board industry and with the DYCOstrate® process.

A first semifinished foil product with at least one layer of conductors comprising signal conductors and shielding conductors is connected with at least one further semifinished foil product with shielding material. Advantageously, the shielding material is laminated on by dielectric material with at least one layer of conductors. In a photochemical structuring, the shielding material is provided with openings extending to the dielectric. In a chemical or plasma etching process, or also using laser ablation, the dielectric is removed in accordance with said openings extending to the shielding conductors. The edges of the openings in the shielding material are electrically contacted with said shielding conductors, so that shielding is provided by dielectric-insulated signal conductors, as well as shielding conductors and shielding material.

BRIEF DESCRIPTION OF THE DRAWINGS

The invention is described in greater detail hereinafter 30 referring to the attached drawings, wherein.

DESCRIPTION OF PREFERRED EMBODIMENTS

FIGS. 1 to 5 show a first embodiment of a method for the manufacture of shielded interconnecting conductors 1 from three semifinished foil products H1, H2, H3 (variant with single-layer semifinished foil product H1). These drawings and also the following drawings are schematic and illustrate the sequence of stages of the inventive method rather than showing exact thicknesses of the layers and exact spacings.

The semifinished foil products H1, H2, H3 used have layers of dielectric or insulating material 15, 25, 35, as well as layers of electrically conductive material or layers of conductors 10, 12, 12' or shielding material 23, 33.

Figure 1:
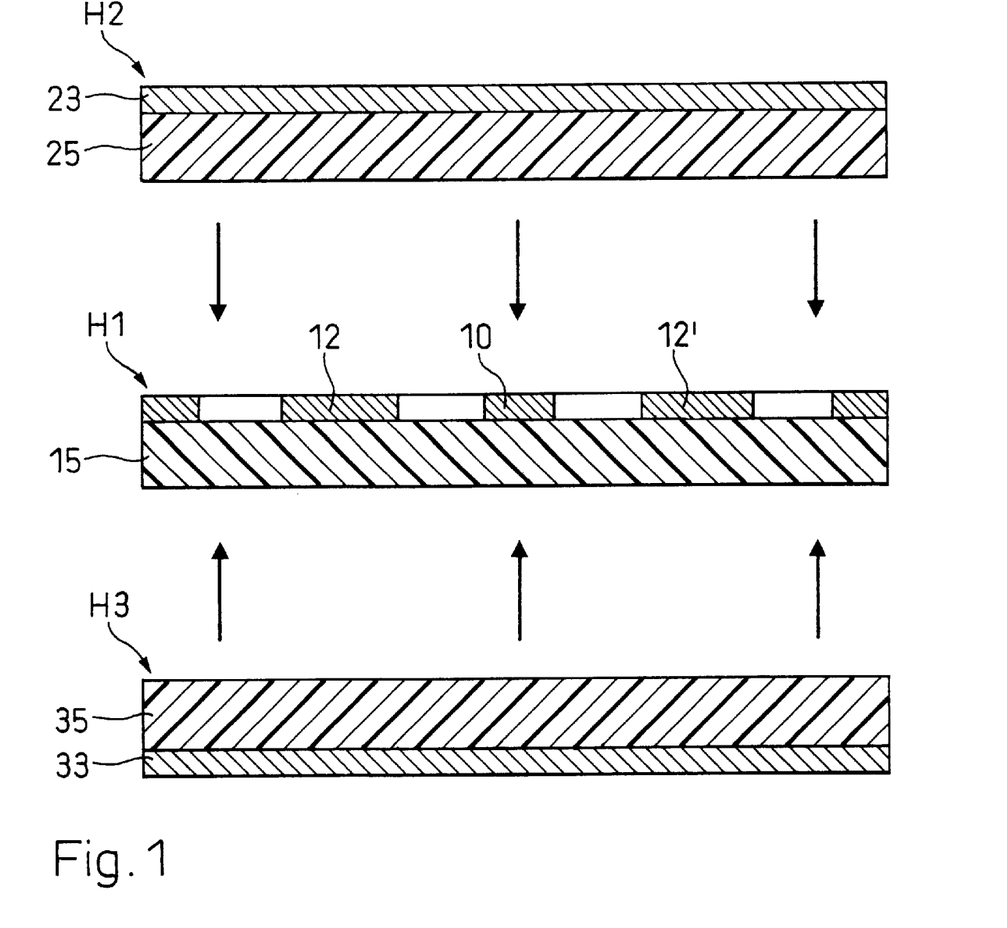
FIGS. 1 to 5 are schematic sectional side elevations of the stages of a first embodiment of a method for the manufacture of shielded interconnecting conductors 1 beginning with three semifinished foil products H1, H2, H3, of which H1 has a single foil layer.

The first semifinished foil product H1 e.g. comprises a 50 μm thick polyimide film as the dielectric 15, on one side of which is laminated, e.g., an 18 μm thick copper foil (this thickness is at present a standard). The conductor foil applied unilaterally according to FIG. 1 is advantageously structured with fine conductors 10, 12, 12'. The use of a layer of dielectric 15 is optional and serves as a mechanical support for signal conductors 10 and shielding conductors 12, 12'. The signal conductors 10 and shielding conductors 12, 12' are typically 10 to 100 μm wide and are advantageously parallel to one another. With the knowledge of the present invention, it will be possible for the expert to use narrower or wider signal conductors and shielding conductors, which at least zonally are inclined with respect to one another.

The further semifinished foil products H2, H3, e.g., comprise adhesive dielectric sheets 25, 35, each of which is laminated on one side, e.g., with an 18 μm-thick copper foil (this thickness is at present a standard) as shielding material layers 23, 33. Advantageously, these shielding material layers 23, 33 are not structured and are surface connected. These joining dielectrics 25, 35, e.g., comprise 25 to 100 μm thick polyimide, acrylate, epoxy or epoxy acrylate compounds. They permit simple, inexpensive and proven joining of the semifinished foil products H1, H2, H3. Such a joining advantageously takes place by lamination under pressure and temperature (indicated by the pressure arrows in FIG. 1). In further, subsequently described method variants, the use of a single-layer, first semifinished foil product H1 and the use of a single further semifinished foil product H2 is described. With the knowledge of the present invention it is also possible to use other conventional metals and alloys as conductors 10, 12, 12' or shielding materials 23, 33. Particular reference is made to the use of metal coatings of aluminum, tin-coated copper, nickel-gold-coated copper, etc. With the knowledge of the invention, the expert can also use thicker or thinner dielectric layers 15, 25, 35 and conductors 10, 12, 12' or shielding material 23, 33. It is naturally also possible to use other, e.g., non-foil-like dielectric materials, or, e.g., non-plasma-etchable dielectric materials, or, e.g., non-chemically etchable dielectric materials, or also, e.g., not or difficultly laser-removable dielectric materials. In particular, layers of such other dielectrics can be relatively rigid, or can be only slightly flexible (unbendable), or it need not be necessary to roll them up. As an example, reference is made to the use of glass fiber-reinforced resin compounds such as FR4, FR5, etc. Such glass fiber-reinforced resin compounds are, e.g., not plasma-etchable, or, e.g., not chemically etchable, or, e.g., cannot be removed or only removed with difficulty using lasers. They can be used in semifinished products, where structuring in the plasma etching process, or in a chemical process, or by laser ablation does not take place or is not absolutely necessary, e.g., as other dielectrics 15 of the semifinished products H1 in the method variants according to FIGS. 6 to 11. The advantage of such glass fiber-reinforced resin compounds is that they can be easily processed and are less expensive than, e.g., polyimide films. Such other dielectrics can be unilaterally or bilaterally provided with metal coatings. They can also form part of further components and fulfill completely different functions, e.g., they can be part of a core of a conventional, i.e., rigid, printed circuit board with drilled through-holes, etc.

Figure 2:
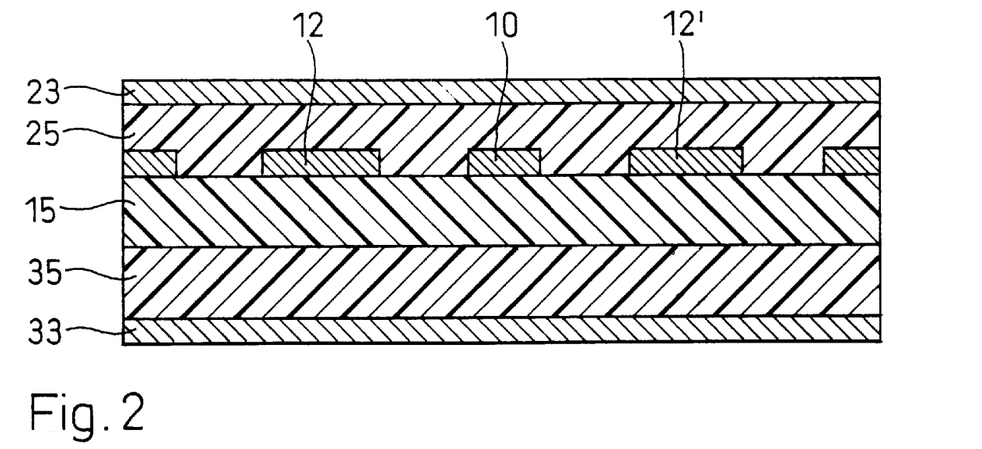

FIGS. 1 and 2 show a first semifinished foil product H1 with at least one layer of conductors 10, 12, 12' comprising signal conductors 10 and shielding conductors 12, 12' joined to at least one further semifinished foil product H2, H3 with shielding material 23, 33. Advantageously, the shielding material 23, 33, is laminated to joining dielectric 25, 35 of the at least one semifinished foil product H2, H3 with the at least one layer of conductors 10, 12, 12' of the semifinished foil product H1. It is naturally also possible to use other standard joining procedures of the printed circuit board industry.

Figure 3:
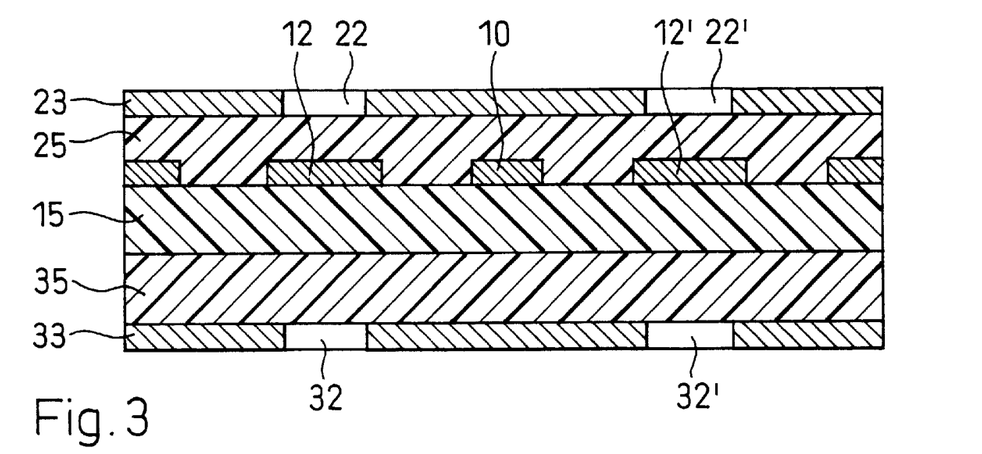

In photochemical structuring according to FIG. 3, the shielding material 23, 33 is provided with openings 22, 22', 32, 32' extending down to the underlying dielectric 15, 25, 35. Advantageously, these openings 22, 22', 32, 32' in the shielding material 23, 33 are made in the vicinity of, i.e., above or below, shielding conductors 12, 12'. These openings 22, 22', 32, 32' in the shielding material 23, 33 virtually follow the path of the shielding conductors 12, 12', so that openings, 22, 22', 32, 32' constitute grooves or slots in the up-to-then continuous shielding material 23, 33.

Figure 4:
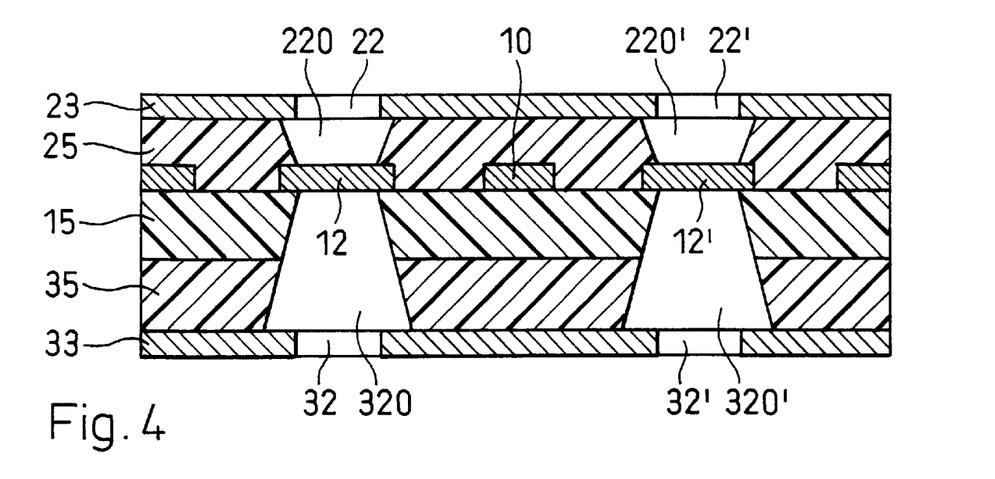

Surface dielectric 15, 25, 35 is exposed by these grooves or slots in the shielding material 23, 33 and is then removed in areas following openings 22, 22', 32, 32' with the exception of the shielding conductors 12, 12'. This removal of dielectric 15, 25, 35 can take place in any chosen manner. It is known to carry out removal by chemical or plasma etching processes, in which the dielectric 15, 25, 35 is etched through. However, it also falls within the scope of the invention to perform such removal by other standard printed circuit board industry procedures, such as, e.g., laser ablation. With the knowledge of the present invention, the expert consequently has numerous possibilities for modifying the inventive method. FIG. 4 shows the exposed shielding conductors 12, 12'. The edges or rims of these openings 22, 22', 32, 32' are, e.g., etched back in a plasma etching process and project over the dielectric openings 220, 220', 320, 320', whose walls are, e.g., oblique.

Figure 5:
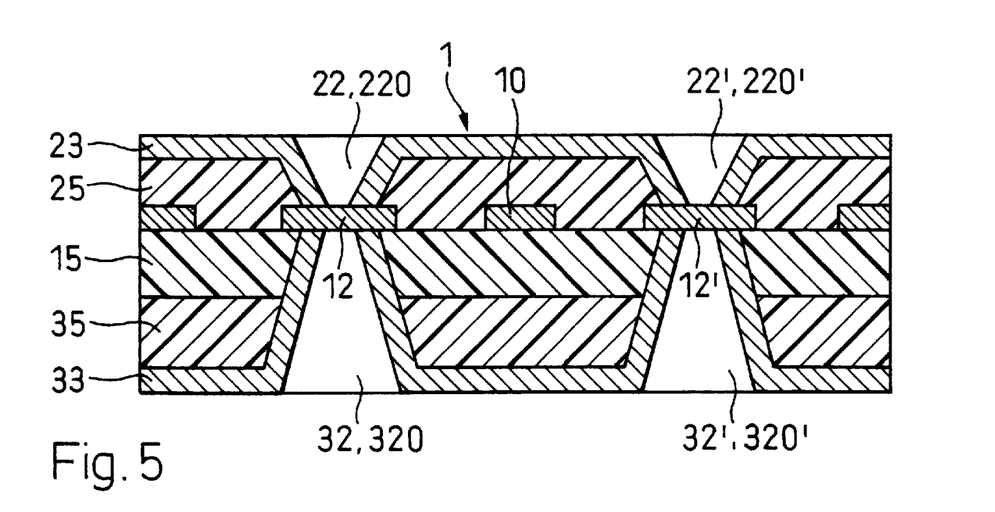

FIG. 5 shows how the edges of these openings 22, 22', 32, 32' in the shielding material 23, 33 are electrically and mechanically permanently contacted with the exposed shielding conductors 12, 12'. With the knowledge of the present invention, the expert once again has numerous possibilities for forming the electric and mechanical permanent contacting effects between the shielding material and shielding conductors. This contacting advantageously takes place in a plating-on process (e.g., by electrodeposition of copper). It is also possible to introduce electrically conductive materials such as, e.g., conductive polymers (conductive pastes or lacquers with silver, copper, gold, aluminum, carbon black, etc.) in openings 22, 22', 32, 32' in shielding material 23, 33 and in dielectric openings 220, 220', 320, 320'. This introduction of conductive material can take place by screen printing, as a dispenser application or manually or in any other way. optionally, the projecting edges around the openings 22, 22', 32, 32' can either be bent around in the direction of the shielding conductors 12, 12' or electrically contacted in a purely mechanical way, or can be selectively etched away as is, e.g., disclosed in the applicants' European application 668,712.

The first embodiment of an interconnecting conductor 1 according to FIG. 5 is characterized by a single signal conductor 10, which is eccentric to the shielding material 23, 33 in a single conductor layer. This signal conductor 10 is insulated by dielectric 15, 25, 35 and is completely shielded by shielding conductors 12, 12' and shielding material 23, 33. The further embodiments of inventively manufactured interconnecting conductors 1 constitute variants thereto. It is important to point out that finely structured shielding conductors 12, 12' run in a largely parallel and spaced manner in the layer of finely structured signal conductor 10 to be shielded, that the layers of joining dielectric 25, 35 and supporting dielectric 15 are largely constant, and that the etching away of dielectric 15, 25, 35 preferably takes place in a controlled manner above shielding conductors 12, 12', so as to ensure retention of the selected dielectric thicknesses throughout the foil printed circuit board to be manufactured and specifically for high frequency applications (frequencies>1 GHz). Thus, shielding conductors 12, 12' follow signal conductor 10 to be shielded in much the same way as a dike or bank follows a river.

Figure 6:
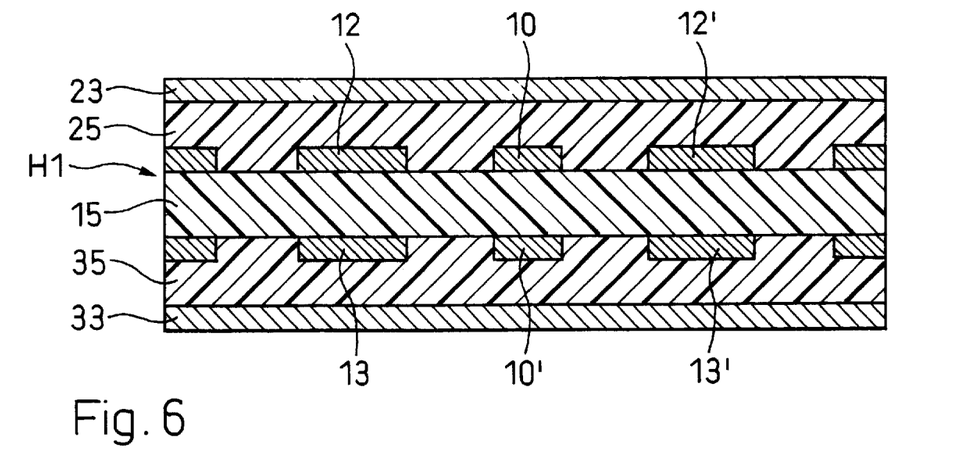
FIGS. 6 & 7 are similar sectional views of a further embodiment of a method for the manufacture of shielded interconnecting conductors 1 from three semi-finished foil products H1, H2, H3, this embodiment starting with a two-layer semifinished foil product H1.
Figure 7:
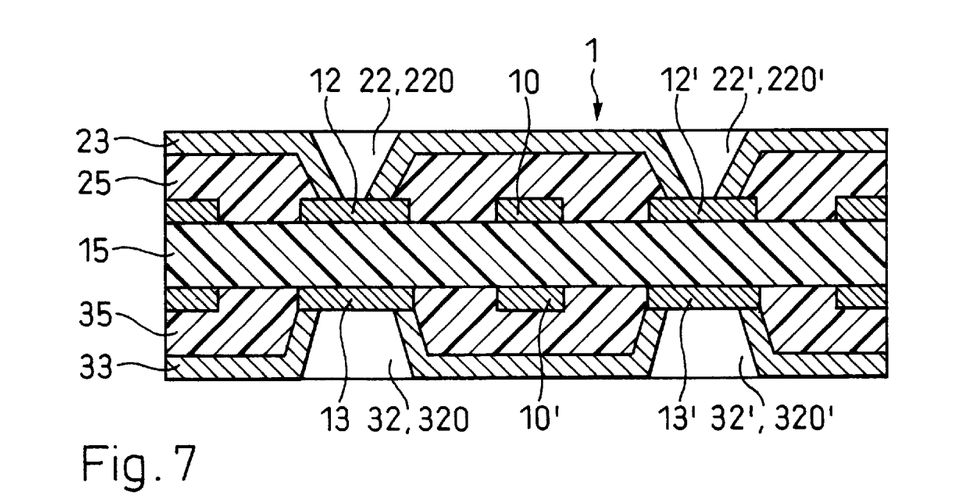

FIGS. 6 and 7 show a further method embodiment for the manufacture of shielded interconnecting conductors 1 from three semifinished foil products H1, H2, H3 (variant with two-layer semifinished foil product H1). This variant is very similar to those according to FIGS. 1 to 5, the sole difference being in the use of a first semifinished foil product H1 bilaterally provided with conductors 10, 10', 12, 12', 13, 13', so that only the laminated semifinished foil products according to FIG. 6 (like FIG. 2) and the further embodiment of an interconnecting conductor 1 according to FIG. 7 (like FIG. 5) are shown. The embodiment of an interconnecting conductor 1 according to FIG. 7 has two parallel signal conductors 10, 10', of which one is in a layer of conductors 10, 12, 13 and the other is in another layer of conductors 10', 12', 13', said layers being separated from one another by dielectric 15. These signal conductors 10, 10' are eccentric to the shielding material 23, 33.

Figure 8:
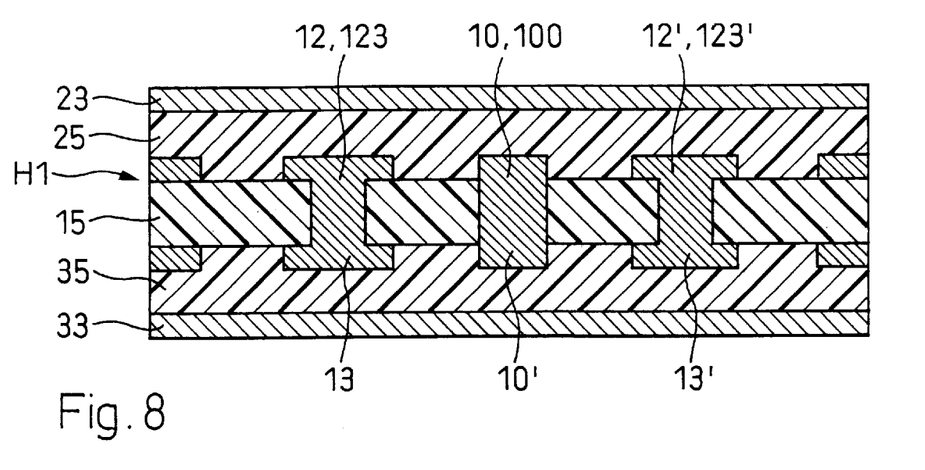
FIGS. 8 & 9 are sectional views of a further embodiment of a method for the manufacture of shielded interconnecting conductors 1 from three semi-finished foil products H1, H2, H3, this embodiment starting with a two-layer, plated-through semifinished foil product H1.
Figure 9:
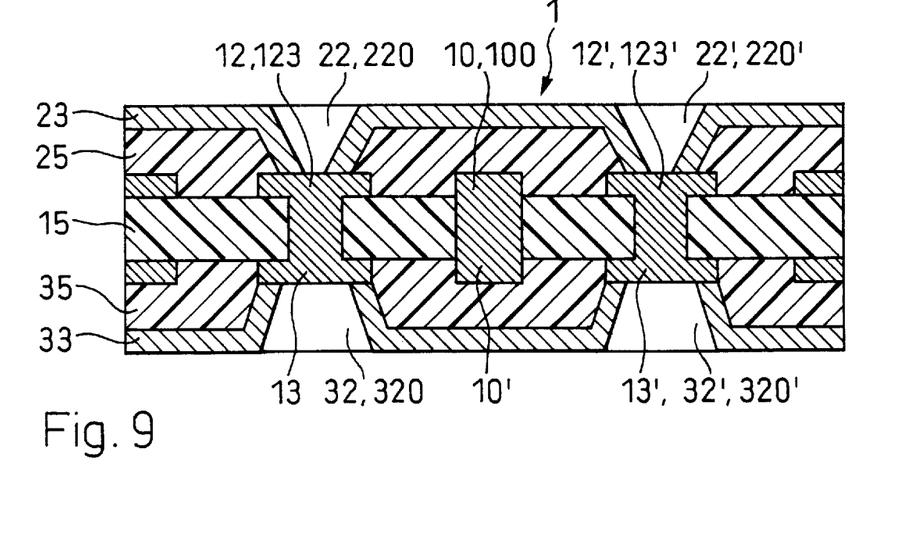

FIGS. 8 and 9 show another method embodiment for the manufacture of shielded interconnecting conductors 1 from three semifinished foil products H1, H2, H3 (variant with two-layer, plated-through semifinished foil product H1). This embodiment is also largely similar to those according to FIGS. 1 to 7. The difference relates to the use of a first semifinished foil product H1 bilaterally provided with conductors 10, 10', 12, 12', 13, 13', said conductors 10, 10', 12, 12', 13, 13' being connected beforehand in method stages which are not shown but which can, e.g., be in accordance with the DYCOstrates® process, to plated-through conductors 100, 123, 123'. The signal conductors 10, 10' of two layers separated by a dielectric 15 are connected to a plated-through signal conductor 100, the shielding conductors 12, 12' of one layer and the shielding conductors 13, 13' of the further layer separated therefrom by a dielectric 15 being connected to plated-through shielding conductors 123, 123'. Once again, only the laminated semifinished foil products according to FIG. 8 (like FIGS. 2 and 6) and the further embodiment of an interconnecting conductor 1 according to FIG. 9 (like FIGS. 5 and 7) are shown. The embodiment of an interconnecting conductor 1 according to FIG. 9 is characterized by a signal conductor 100, which runs concentrically to the shielding material 23, 33 in two conductor layers.

Figure 10:
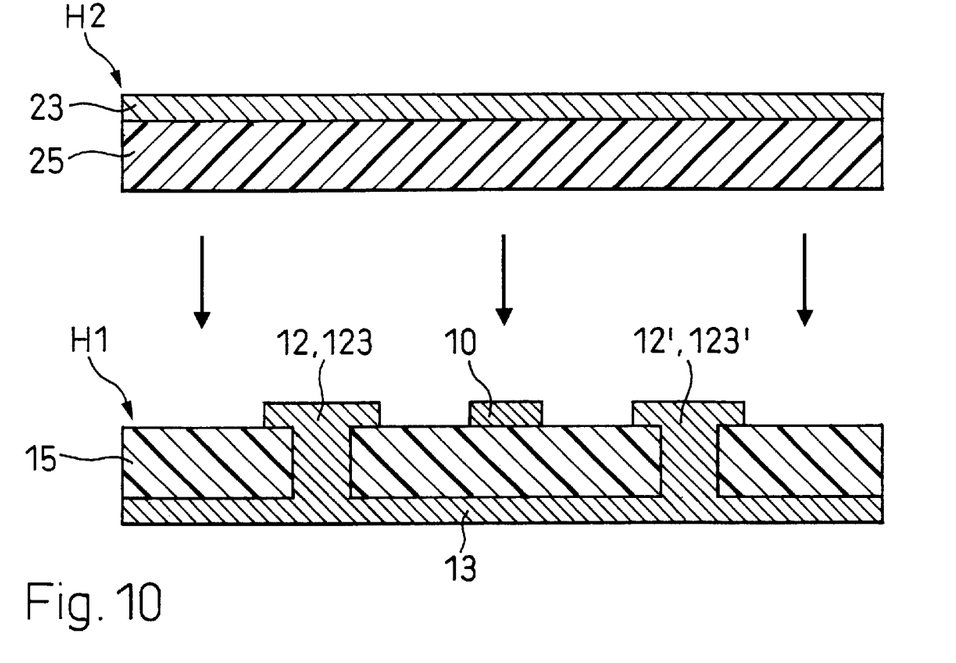
FIGS. 10 & 11 are sectional views of a method for the manufacture of shielded interconnecting conductors 1 from two semi-finished foil products H1, H2, this embodiment using a two-layer, semifinished foil product H1.
Figure 11:
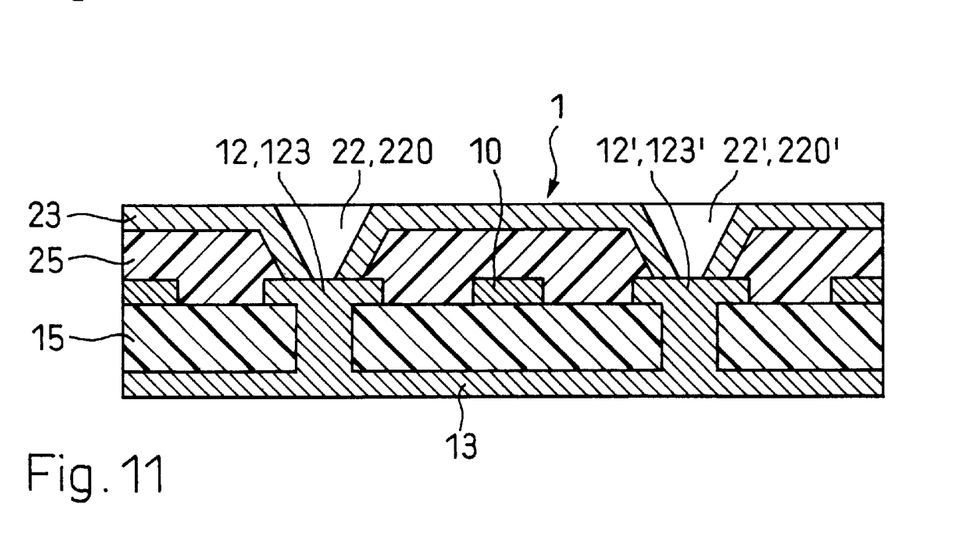

FIGS. 10 and 11 show a further method embodiment of the manufacture of shielded interconnecting conductors 1 from two semifinished foil products H1, H2 (variant with two-layer semifinished foil product H1). This embodiment is largely similar to that according to FIGS. 8 and 9. The first difference is in the use of a single, not plated-through signal conductor 10 in a first semifinished foil product H1 provided with two layers of conductors 10, 12, 12', 13, which are separated from one another by a dielectric 15. The shielding conductors 12, 12', 13 are interconnected to plated-through shielding conductors 123, 123' in preceding method stages not shown, e.g., in accordance with the DYCOstrates® method. The further difference is that only one further semifinished foil product H1 and consequently only one layer of shielding material 23 is connected to the semifinished foil product H1 (cf. FIG. 10). FIG. 11 (like FIG. 9) shows the resulting, further embodiment of an interconnecting conductor 1. This interconnecting conductor 1 according to FIG. 11 has a signal conductor 10, which is eccentric to the shielding material 23 and the plated-through shielding conductors 123, 123'.

With the knowledge of the present invention, the method variants shown can be further combined, but this does not further assist the understanding of the inventive method, so such variations are not illustrated by further drawings.

Thus, the embodiment of interconnecting conductors 1 which can be manufactured according to the method of FIGS. 6 and 7 is not restricted to parallel signal conductors 10, 10' (according to FIG. 7). Thus, it is possible for the signal conductors 10, 10' to be inclined in other areas (e.g., crossing one another).

Thus, the embodiments of interconnecting conductors 1 which can be made according to the methods of FIGS. 1 to 11 are not restricted to first semifinished foil products H1 comprising only one dielectric layer 15 with one or two layers of conductors 10, 10', 12, 12', 13, 13' and naturally higher-layer, first semifinished foil products with more than one dielectric layer and with more than two mutually insulated and/or plated-through layers of conductors can be used.

What is claimed is:

1. A method for manufacturing shielded interconnecting conductors (1) from semifinished products (H1, H2, H3) comprising the steps of:

providing a first semifinished product (H1) having at least one layer of conductors, said at least one layer of conductors including signal conductors (10, 10') and shielding conductors (12, 12', 13, 13');

providing at least one second semifinished product (H2, H3), said at least one second semifinished product having shielding material (23, 33);

joining with a dielectric layer (15, 25, 35) the second semifinished product to the at least one layer of conductors (10, 10', 12, 12', 13, 13');

photochemically structuring the shielding material (23, 33) to provide openings (22, 22', 32, 32') therein, said openings following the shielding conductors (12, 12', 13, 13') and extending to the dielectric (15, 25, 35);

selectively removing portions of the dielectric (15, 25, 35) at locations of the openings (22, 22', 32) in the shielding material (22, 33) until the openings extend to the shielding conductor (12, 12', 13, 13'); and, forming electrical connections between the shielding material (23, 33) and the shielding conductors (12, 12', 13, 13') through the openings in the shielding material so that said signal conductors (10, 10') are insulated by dielectric (15, 25, 35) and are shielded by the shielding conductors (12, 12', 13, 13'), which are electrically connected to the shielding material.

2. The method according to claim 1, wherein the first semifinished product (H1) comprises a layer of conductors (10,12, 12') on a first dielectric layer (15), the method comprising the further step of:

joining a third semifinished product (H3) with shielding material (33) by a third dielectric layer (35) to the first dielectric layer (15).

3. The method according to claim 1, wherein the first semifinished product (H1) has two layers of conductors (10, 10', 12, 12', 13, 13'), a first of said two layers of conductors being disposed on one side of said first dielectric while a second of said two layers of conductors is disposed on an opposite side of the first dielectric, the method including the further step of:

joining said at least one second semifinished product (H2) with shielding material (23) to a first layer of the conductors with a second layer of dielectric (25), and joining a third semifinished product (H2) with shielding material (33) to the second layer of the conductors with a third layer of dielectric (35).

4. The method according to claim 1, wherein the first semifinished product (H1) has first and second layers of conductors (10, 10', 12, 12', 13, 13'), said first layer of conductors including signal conductors between shielding conductors on one side of a first dielectric and said second layer of conductors including signal conductors between shielding conductors on an opposite side of the first dielectric and wherein the signal conductors (10, 10') on opposite sides of the first dielectric are connected to each other by electrical connections (100) through the first dielectric and wherein the shielding conductors (12, 12', 13, 13') on opposite sides of the first dielectric are connected to each other by electrical connections (123, 123') through the first dielectric.

5. The method according to claim 1, wherein each signal conductor is between and spaced from two closest shielding conductors of the same layer of conductors, the step of forming including electrically connecting the shielding material to the two closest shielding conductors.

6. The method according to claim 5, wherein first and second layers of signal conductors and shielding conductors are provided between first and second layers of shielding material, including connecting the shielding material to closest ones of the shielding conductors on opposite sides of a signal conductor.

7. The method according to claim 1, wherein the step of selectively removing includes removing dielectric material by chemical or plasma etching.

8. The method according to claim 1, wherein the step of selectively removing includes removing dielectric material by laser ablation.

9. The method according to claim 1, wherein edges of openings formed in the shielding material are electrically connected to the shielding conductors by plating on conductive material.

10. The method according to claim 1, wherein edges of openings formed in the shielding material are electrically connected to the shielding conductors by inserting an electrically conductive polymer in contact with said conductors and said material.

11. The method according to claim 1, wherein edges of the shielding material overhang openings in the dielectric material, including bending the overhanging edges into the openings in the dielectric material.

12. The method according to claim 1, including selectively etching away edges of the shielding material around the openings.

13. A circuit structure having shielded signal conductors comprising:

a bendable layer of conductors including signal conductors and shielding conductors;

bendable first and second layers of dielectric material on opposite sides of said layer of conductors;

first and second layers of substantially continuous bendable shielding material, said first and second layers of shielding material being disposed on surfaces of said first and second layers of dielectric material facing away from said layer of conductors; and electrical connections between said shielding material and said shielding conductors, said shielding material, said shielding conductors and said electrical connections cooperating to form enclosing shields around said signal conductors.

14. The circuit structure according to claim 13, wherein said signal conductors extend centrally coaxially within said shielding material.

15. The circuit structure according to claim 13, wherein said signal conductors extend eccentrically relative to said shielding material.

16. The circuit structure according to claim 13, further comprising a plurality of layers of signal conductors, and wherein conductors of one layer are at an angle to conductors of another layer.

* * * * *